(12) United States Patent
Tsunoda (10) Patent No.: US 7,365,677 B2
(45) Date of Patent: Apr. 29, 2008

(54) COMPACT RADAR TEST RANGE

(75) Inventor: Stanley Isamu Tsunoda, Berlin, MA (US)

(73) Assignee: General Atomics Aeronautical Systems, Inc., San Diego, CA (US)

( * ) Notice: Subject to any disclaimer, the term of this patent is extended or adjusted under 35 U.S.C. 154(b) by 189 days.

(21) Appl. No.: 11/254,370

(22) Filed: Oct. 19, 2005

(65) Prior Publication Data

US 2007/0085730 A1    Apr. 19, 2007

(51) Int. Cl.
*G01S 7/40* (2006.01)
(52) U.S. Cl. .................. 342/165; 342/167; 342/171; 342/172
(58) Field of Classification Search .............. 342/1–4, 342/165–175
See application file for complete search history.

(56) References Cited

U.S. PATENT DOCUMENTS

| | | | |
|---|---|---|---|
| 3,500,407 A * | 3/1970 | Thompson | 342/171 |
| 3,783,447 A * | 1/1974 | Sanders | 342/169 |
| 4,450,447 A * | 5/1984 | Zebker et al. | 342/171 |
| 6,738,009 B1 * | 5/2004 | Tsunoda | 342/25 A |
| 2004/0201518 A1* | 10/2004 | Pace et al. | 342/169 |
| 2006/0267832 A1* | 11/2006 | Newberg et al. | 342/169 |
| 2007/0085730 A1* | 4/2007 | Tsunoda | 342/165 |

* cited by examiner

*Primary Examiner*—John B Sotomayor
(74) *Attorney, Agent, or Firm*—Fitch, Even, Tabin & Flannery (57) ABSTRACT

A system for testing radar in accordance with one embodiment comprising a target motion platform; a target motion platform controller for controlling motion of the platform; a radar responsive tag and a delay line located on the target motion platform; the radar which is being tested; and a motion measurement simulator for inputting data to the radar electronics assembly to simulate movement of the radar. In some embodiments the system further comprises a radar motion platform, wherein the radar electronics assembly is positioned on the radar motion platform; a radar motion platform controller for controlling the movement of the radar motion platform; and a master controller coupled to the radar motion platform controller and the target motion platform controller.

23 Claims, 7 Drawing Sheets

$$x(t) = -d \left[ 1 - \frac{S^2}{d^2 \Omega^2(t)} ((1-\Omega^2(t))\sin^2(\theta - \omega t) + \tan^2\phi \cos^2(\theta - \omega t)) + \frac{S^2}{d^2} \cos^2(\theta - \omega t) \left(1 + \frac{\tan^2\phi}{\Omega^2(t)}\right) \left(1 + \frac{S^2}{R^2}\psi^2(t)\right) \right]^{\frac{1}{2}} \bigg/ \left[\left(1 + \frac{\tan^2\phi}{\Omega^2(t)}\right)^{\frac{1}{2}} \left(1 + \frac{S^2}{R^2}\psi^2(t)\right)^{\frac{1}{2}}\right] - S\cos((\theta - \omega t))$$

COMPACT RADAR TEST RANGE

BACKGROUND OF THE INVENTION

1. Field of the Invention

The present invention relates to testing radar systems. More specifically, the present invention relates to a compact range for testing radar systems.

2. Discussion of the Related Art

One of the final steps in testing and qualifying airborne radar is to flight test it. Once a minimum set of fight tests is performed and the radar is deemed working, a specified burn-in is flown to mitigate problems associated with infant mortality. The flight in the aircraft applies motion, vibration, realistic flight temperatures and altitudes, and other environmental characteristics relevant to the real world operation of the radar. Flight testing is considered to be the final arbiter of a good radar system. Flight testing is especially important for synthetic aperture radar (SAR). These types of radars require precise knowledge of the motion of the aircraft to form the imagery they produce. Because of limited access to airplanes and the high cost of testing radars on aircraft, however, there is a need to find a substitute for some aspects of the flight test and burn-in when a radar system needs to be tested.

Large outdoor ranges have been envisioned in order to simulate the movement of radar. SAR imagery relies on relative motion between the radar and the target and refers to the situation where the radar moves and the target is fixed. When the target moves and the radar stays fixed, the radar is termed an inverse synthetic aperture radar (ISAR). In order to simulate movement of the radar using ISAR, one or more targets are typically placed on a rotating table and with the radar stationary. The radar thus makes an image as if it were flying around the targets in a circular orbit.

The problem with the ISAR scheme is that the minimum range at which the radar can work is often very large. These long minimum ranges are determined by the time the radar takes to receive the pulse after it has transmitted it. Due to pulse risetimes and other timing considerations, this minimum range is about 500 meters in a typical radar system. Additionally, there may be other difficulties with such a rapid switching in other parts of the radar circuitry, notably in the digital waveform synthesizer. Moreover, working at such minimum ranges is very different from the normal operation of the radar, where ranges of the order of 4 km to 80 km or more are typical.

Such large minimum ranges mean that the ISAR range usually needs to be placed outdoors. Siting such a range can be quite a challenge in a business park environment where trees and buildings make it very difficult to find an adequately long line of sight distance that is also safe from the point of view of human radio frequency exposure. Rooftop to rooftop systems may be envisioned, but these can also be problematical. It may be hard to find buildings that are sufficiently stable mechanically to support a turntable on which to move the targets the radar will image. In addition, outdoor turntable systems are susceptible to uncompensated motion due to wind.

Therefore, a system which can test a radar system without the need for an aircraft or a large outdoor range is needed in order to overcome the above mentioned problems.

SUMMARY OF THE INVENTION

A compact radar test range is provided that overcomes the problems mentioned above. The compact radar test range also provides solutions to other problems as will be apparent from the detailed description provided herein.

One embodiment can be characterized as a compact radar test range comprising a radar; a moving platform; and a radar responsive tag positioned on the moving platform.

Another embodiment can be characterized as a system for testing radar comprising a target motion platform; a target motion platform controller for controlling motion of the platform; a tag located on the target motion platform; the radar which is being tested; and a motion measurement simulator for inputting data to the radar to electronically simulate movement of the radar. In some embodiments the system further comprises a radar motion platform to provide testing of the motion measurement and motion compensation of the radar, wherein the radar is positioned on the radar motion platform; a radar motion platform controller for controlling the movement of the radar; and a master controller coupled to the radar motion platform controller and the target motion platform controller.

A method for testing radar comprising sending signals from a radar; receiving the signals at a tag; delaying the signals received from the radar; moving the tag in a predetermined manner to simulate movement of the radar while sending signals back to the radar. The method further can include providing the radar with data that corresponds to the predetermined movement of the tag; moving the radar to simulate flying conditions; and measuring the movement of the radar with an inertial measurement unit.

BRIEF DESCRIPTION OF THE DRAWINGS

The above and other aspects, features and advantages of the present invention will be more apparent from the following more particular description thereof, presented in conjunction with the following drawings, wherein:

FIG. 11 illustrates the path difference normalized to the wavelength as a function of the radar displacement shown in FIG. 10; and Corresponding reference characters indicate corresponding components throughout the several views of the drawings. Skilled artisans will appreciate that elements in the figures are illustrated for simplicity and clarity and have not necessarily been drawn to scale. For example, the dimensions, sizing, and/or relative placement of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will also be understood that the terms and expressions used herein have the ordinary meaning as is usually accorded to such terms and expressions by those skilled in the corresponding respective areas of inquiry and study except where other specific meanings have otherwise been set forth herein.

DETAILED DESCRIPTION

The following description is not to be taken in a limiting sense, but is made merely for the purpose of describing the general principles of the invention. The scope of the invention should be determined with reference to the claims. The present embodiments address the problems described in the background while also addressing other additional problems as will be seen from the following detailed description.

Figure 1:
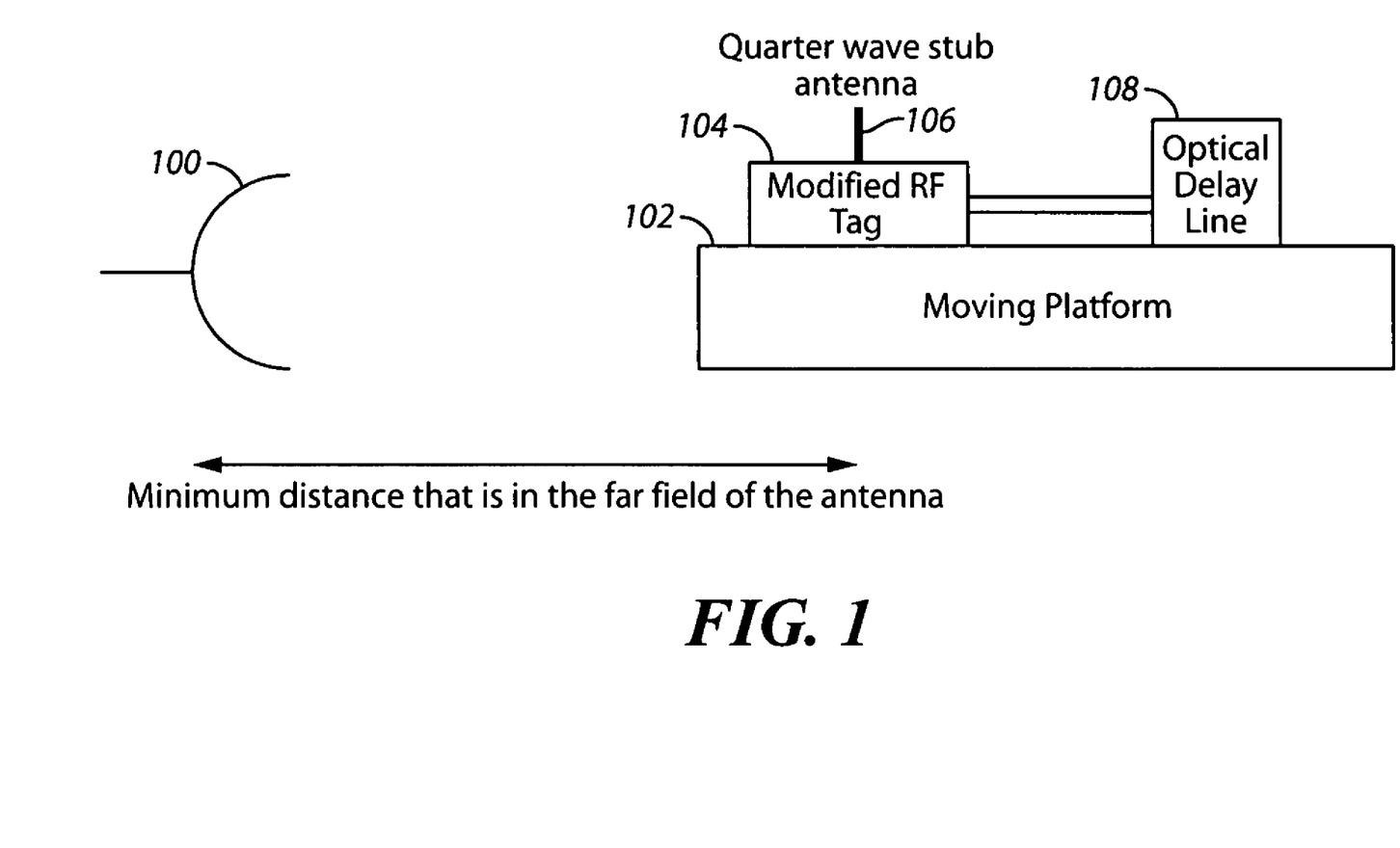
FIG. 1 is a diagram illustrating a compact radar test range.

Referring to FIG. 1, a diagram is shown illustrating a compact radar test range. Shown is a radar 100, a moving platform 102, a tag 104, an antenna 106, and a delay 108.

In some embodiments, the radar 100 is placed at least a minimum distance that is in the far field of an antenna of the radar. In some embodiments, the compact radar test range requires distances of 25 meters or less from the radar 100 to the antenna 106. Additionally, the compact radar test range is preferably situated indoors. The tag 104 is coupled to the antenna 106 and the delay 108 and is mounted on the moving platform 102. The moving platform 102 is one means for moving the tag relative to the radar 100, however, other devices for moving the tag 104 are used in alternative embodiments. In one embodiment, the delay 108 is an optical delay line, however, other delay mechanisms are used in alternative embodiments.

In operation, the radar 100 is substantially stationary and emits a pulse to the tag 104 (e.g., an RF tag). As will be discussed herein below, the radar 100 can be shaken or slightly moved in order to simulate the vibrations that occur on an aircraft. There will be prompt return of the pulse to the radar 100 due to the passive reflection of the pulse from the tag 104. The reflection of the pulse will be ignored by the radar 100 as the pulse will not be coincident with a receive enable control gate of the radar 100. The prompt return of the pulse may also be mitigated with radar absorbing material placed on the tag 104 and the moving platform 102. The pulse is received by the tag 104, which is, in one embodiment, a gain block tag. In one embodiment, no chopping or mixing is performed by the tag 104.

The tag is, in one embodiment, a radar responsive transponder which includes a receiving antenna, an amplifier, a delay, and a transmitting antenna. When operating, the tag continuously receives, delays, and retransmits the radar pulses as it moves on the platform. The tag may or may not modify the radar waveform. The receiving and transmitting antennas may or may not be the same physical structure. In the present embodiment, instead of the pulse being sent to a surface acoustic wave (SAW) delay line, as is done in a normal tag, the pulse is sent to the optical delay line. The optical delay line 108 has a fixed time delay and sends the pulse back to the tag 104 which the tag 104 transmits back to the radar 100. The length of the delay corresponds to the range of the radar. In one embodiment, no modulation is imposed on the pulse. Generally, the tag 104 serves as a way to interface the optical delay line with the radar 100 (i.e., a way to delay the radar signal to simulate normal operational radar distances). A variable gain setting within the tag 104 adjusts the amplitude of the return signal. A quarter wave stub antenna is shown in the figure as the tag antenna. In one embodiment, the quarter wave stub antenna is utilized because it can be precisely located and has a nominally cylindrically symmetric antenna pattern. Other antenna configurations are used in alternative embodiments.

The tag 104 (including the optical delay line) allows for a radar system to be tested by accurately simulating imaging at a far range. Testing the radar under these far range conditions (such as how the radar would normally be utilized on an aircraft) allows for an accurate testing of the motion measurement system of the radar 100. The errors associated with motion measurement have a relationship such that the longer one flies an aperture in order to create the image, the greater the error in the positional measurement. Thus, it is important to test the radar under long range conditions in order to make sure the radar is properly functioning. The combination of the tag 104 and delay 108 allow for the simulated long range testing. As described above, the delay 108 can be incorporated into the tag 104 or can be interfaced with the tag 104.

Figure 2:
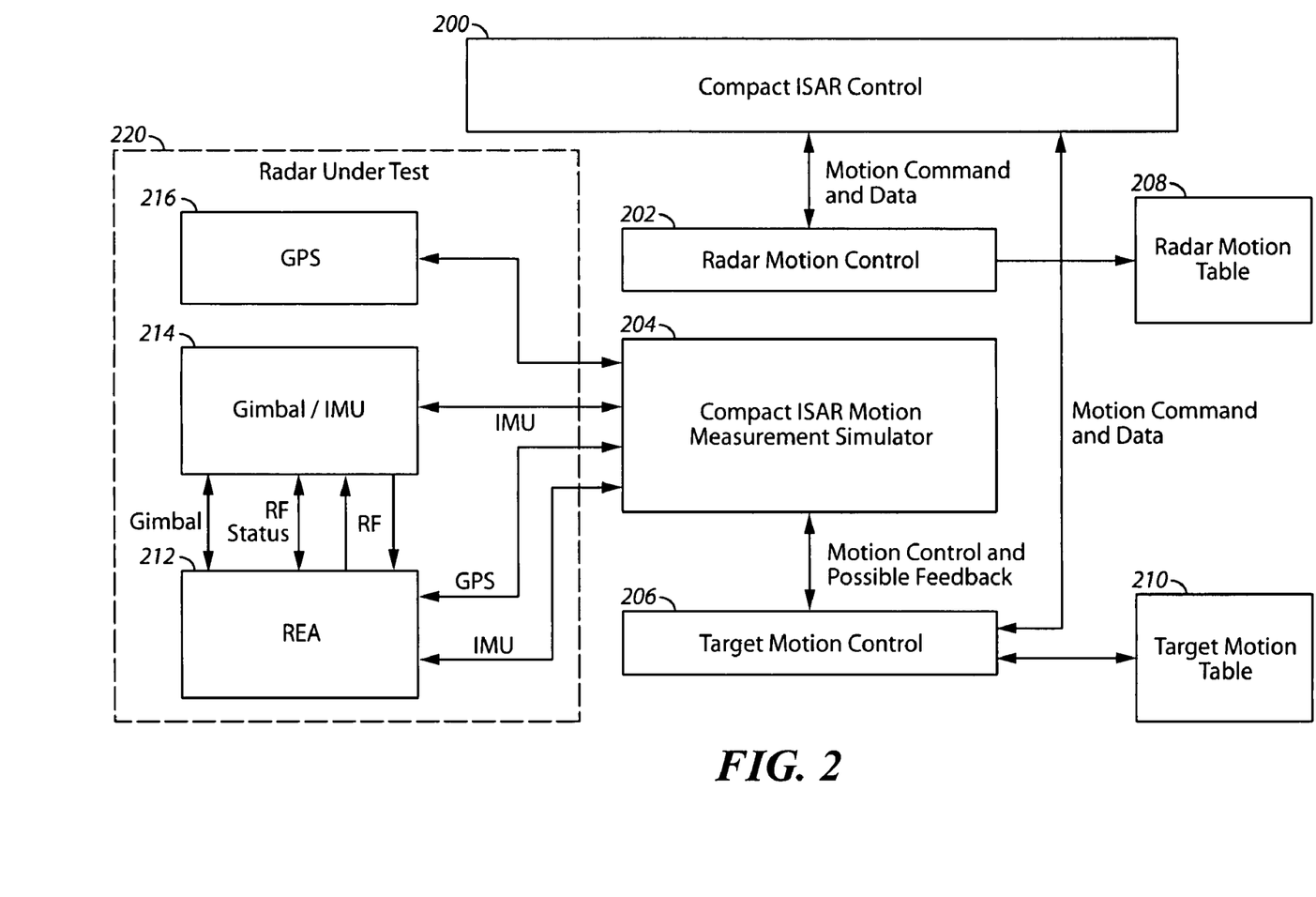
FIG. 2 is a functional diagram illustrating a compact radar test range.

Referring to FIG. 2, a functional diagram illustrating the compact radar test range. Shown is a ISAR controller 200, a radar motion controller 202, a ISAR motion measurement simulator 204, a target motion controller 206, a radar motion table 208, a target motion table 210, a radar electronics assembly 212, an inertial measurement unit (IMU) 214, a global positioning system 216 and a radar 220. The radar 220 includes the radar electronics assembly 212, the inertial measurement unit (IMU) 214 and the global positioning system 216.

The ISAR controller 200, also referred to as a master controller, is coupled to the radar motion controller 202 and the target motion controller 206. The ISAR controller 200 provides overall control for the compact radar test range. The ISAR controller 200 initiates the radar motion table 208 and logs data and additionally initiates the target motion table 210 and logs data. The radar motion controller 202 controls the movement of the radar motion table 208. The radar motion table 208 provides vibration for the radar electronics assembly 212 that simulates the normal vibrations that occur when the radar is mounted on an aircraft. The target motion controller 206 controls the movement of the target motion table 210. As described above with reference to FIG. 1, the tag is mounted on the target motion table 210. The tag is moved in relation to the radar to simulate the movement of the radar when imaging an object from an aircraft.

The target motion controller 206 is also coupled to the ISAR motion measurement simulator 204. The ISAR motion measurement simulator 204 additionally is coupled to the GPS 216 and the IMU 214. The GPS 216 and IMU 214 provide signals representing the true motion of the radar are input into the ISAR motion measurement simulator 204. The ISAR motion measurement simulator 204 takes these signals and determines the true motion of the radar. The ISAR motion measurement simulator 204 then controls the target motion and in one embodiment, assumes a uniform rotation rate. As will be described herein below in greater detail, the equivalent platform motion is added to the true motion of the radar. The motion is then converted back into GPS and IMU raw data and sent to the radar electronics assembly 212. The data from the ISAR motion measurement simulator 204 causes the radar electronics assembly 212 to assume that it is moving about a target in a predefined motion. For example, the data will simulate a radar moving in a large circle around a target image area.

The radar 220 is a very sensitive receiver and the compactness of the range means that a lot of unintentional signals can possibly interfere with the desired signals from the tag. In one embodiment, the range is enclosed within a chamber. The radar 220 is operated remotely from within or outside the chamber. Preferably, the geometry of the dish, target, and chamber are such as to limit spurious reflections. In one embodiment, the chamber and the motion table are covered with radar absorbing material in order to limit the spurious reflections. Additionally, in one embodiment, all of the radar subassemblies are on a vibration table to simulate the vibrations that occur during flight. One or more targets (e.g., tags) may be utilized. In one embodiment, one target may be stationary and placed at the motion compensation point (described herein below), and other targets have controlled motion.

The following description of FIGS. 3-11 provides calculations for determining the locations of the equipment in the compact radar test range and the relative motion between the radar and the tag in order to simulate an actual flight test of a radar system. In one embodiment, the distance to the tag from the radar is the shortest possible distance that is still within the far field of the antenna. The far field or Fraunhofer region of a flat plate is given by $$R_c \geq \frac{2D^2}{\lambda} \quad (1)$$

For one exemplary antenna, D=15.5 inches; at 18.2 GHz, $\lambda$=1.65 cm, corresponding to $R_c \geq 9.4$ m. The field at this distance corresponds to that from an antenna with a gain that is 0.99 that of the gain at infinity. At half this distance the gain is 0.94 that of the gain at infinity. Therefore, depending on how stringent the requirement is to get good focusing, the minimal distance can be determined.

If it is desired that this compact ISAR configuration simulate a rotating table, then the motion of the moving platform is not circular, but executes an elongated elliptical orbit (demonstrated below). The orbit depends on the depression angle of the radar and the initial position of the target with respect to the motion compensation point. Thus, different targets spatially separated in the scene may have very different orbits. In the following we calculate the desired orbit.

Figure 3:
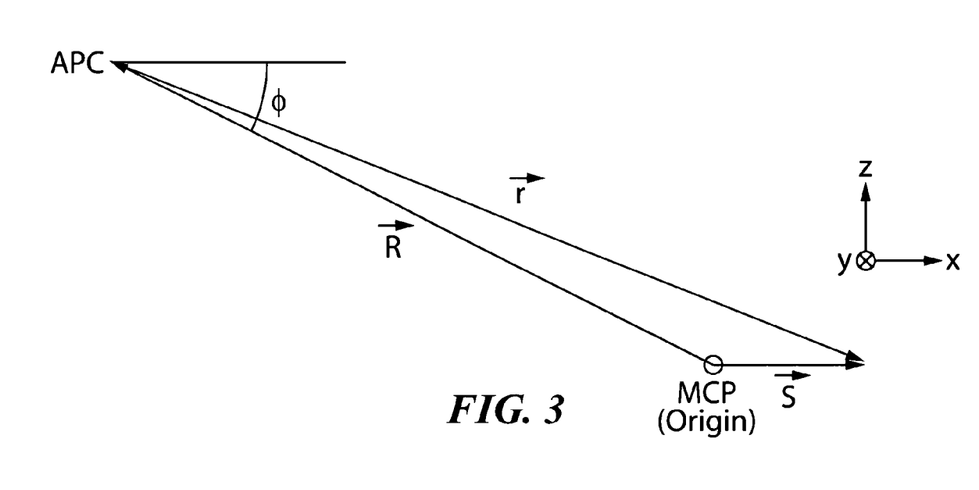
FIG. 3 is a side view illustrating the geometry of a synthetic aperture radar (SAR) system.
Figure 4:
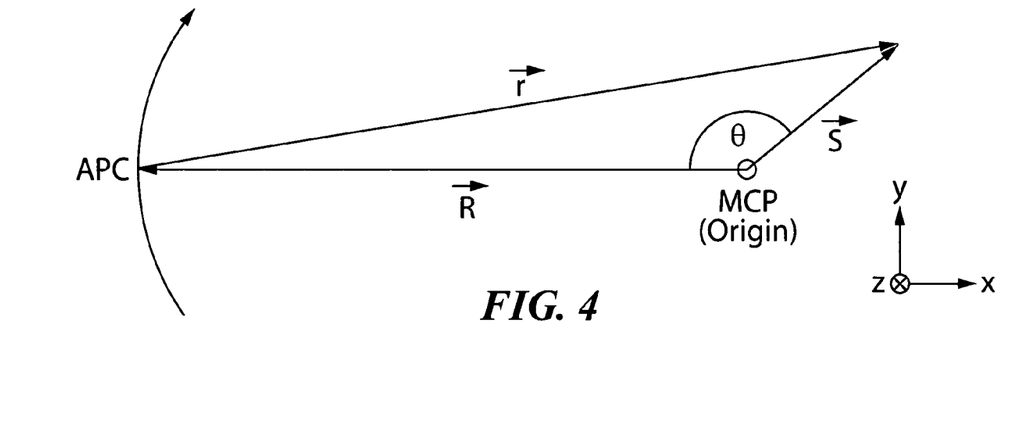
FIG. 4 is a plan view illustrating the geometry of the synthetic aperture radar system of FIG. 3.

In FIGS. 3 and 4 the geometry of a synthetic aperture radar (SAR) system is defined. FIG. 3 shows a side view of the geometry of the SAR system. FIG. 4 shows a plan view of the SAR system geometry. The radar antenna phase center (APC) is looking down at the scene center or motion compensation point (MCP) with depression angle $\phi$. The quantities r, R, and S are all position vectors. S and r point to the target in the scene. The green arrow indicates an upward circular motion (clockwise) for the APC.

The angle of the vector to the target, S, is $\theta$ as shown in FIG. 4. In the SAR geometry, R and r are time dependent and S is stationary. The explicit coordinates of R are:

$R_x = -R \cos \phi \cos \omega t$ $R_y = R \cos \phi \sin \omega t$ $R_z = R \sin \phi \quad (2)$ where the APC is assumed to be executing a circular orbit with angular frequency $\omega$. Notationally, the vector is denoted as R and its magnitude as R. Assuming that the target lies at the same elevation as the MCP and the coordinates of S are:

$S_x = -S \cos \theta$ $S_y = S \sin \theta \quad (3)$

Forming the magnitude of r, we find, $r^2 = R^2 + S^2 - 2RS \cos \phi \cos(\theta - \omega t) \quad (4)$ This is the same expression that would have been obtained the assumption been made that the scene rotates at $-\omega$ where r and S are time dependent and R is stationary. This is the basis for the equality of SAR and ISAR.

Figure 5:
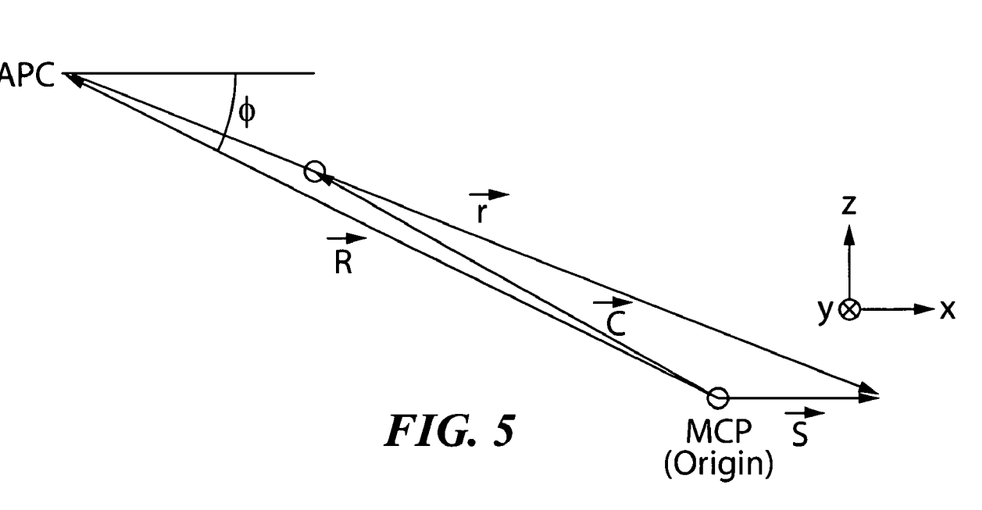
FIG. 5 is a side view illustrating the geometry of an inverse synthetic aperture radar (ISAR) system.
Figure 6:
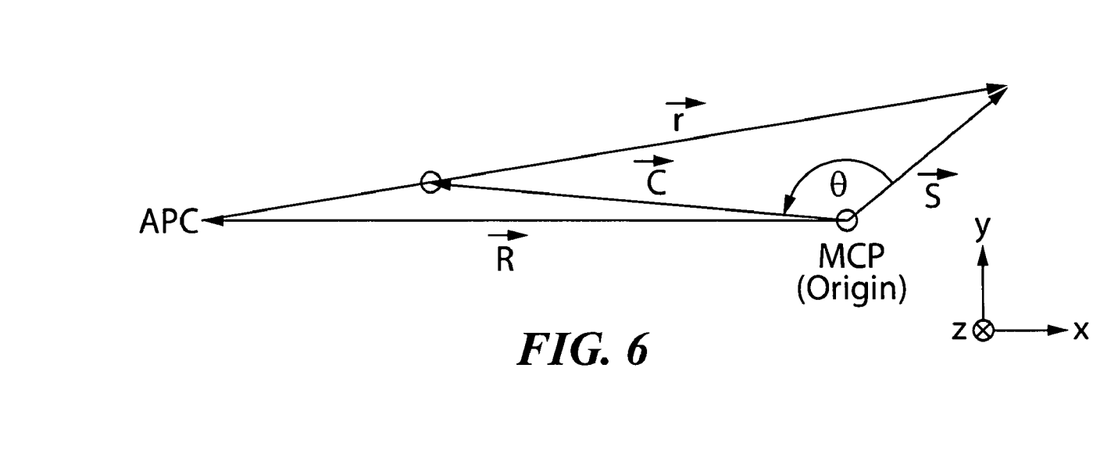
FIG. 6 is a plan view illustrating the geometry of the inverse synthetic aperture radar system of FIG. 5.

Turning now to the geometry of an ISAR system. In FIGS. 5 and 6 the geometry of an inverse synthetic aperture radar (ISAR) system is defined. FIG. 5 shows a side view of the geometry of the ISAR system. FIG. 6 shows a plan view of the ISAR system geometry.

The x coordinate is chosen to be parallel to the stationary R vector. The position of the ISAR target located on the motion table is given by the vector C. The range to this target together with the range associated with the delay line delay is r and so S denotes the vector to the simulated target.

In an ISAR system, S rotates in a circle and the target is placed on a rotating table. In the compact ISAR geometry a circular rotation of S does not correspond to a simple circular trajectory of C. Instead, the trajectory is approximately elliptical. In the range direction the motion of C mirrors the motion of S. In the azimuthal direction, the motion of C is compressed due to the divergence of the range vectors from the APC. The more compact the range is the more compressed the trajectory.

The following demonstrates the solution for the motion of C. The direction and magnitude of C are defined by the following two conditions.

1) $r \times (S-C) = 0$

2) $|S-C| = d$, where $d$ is a constant $\quad (5)$

Figure 7:
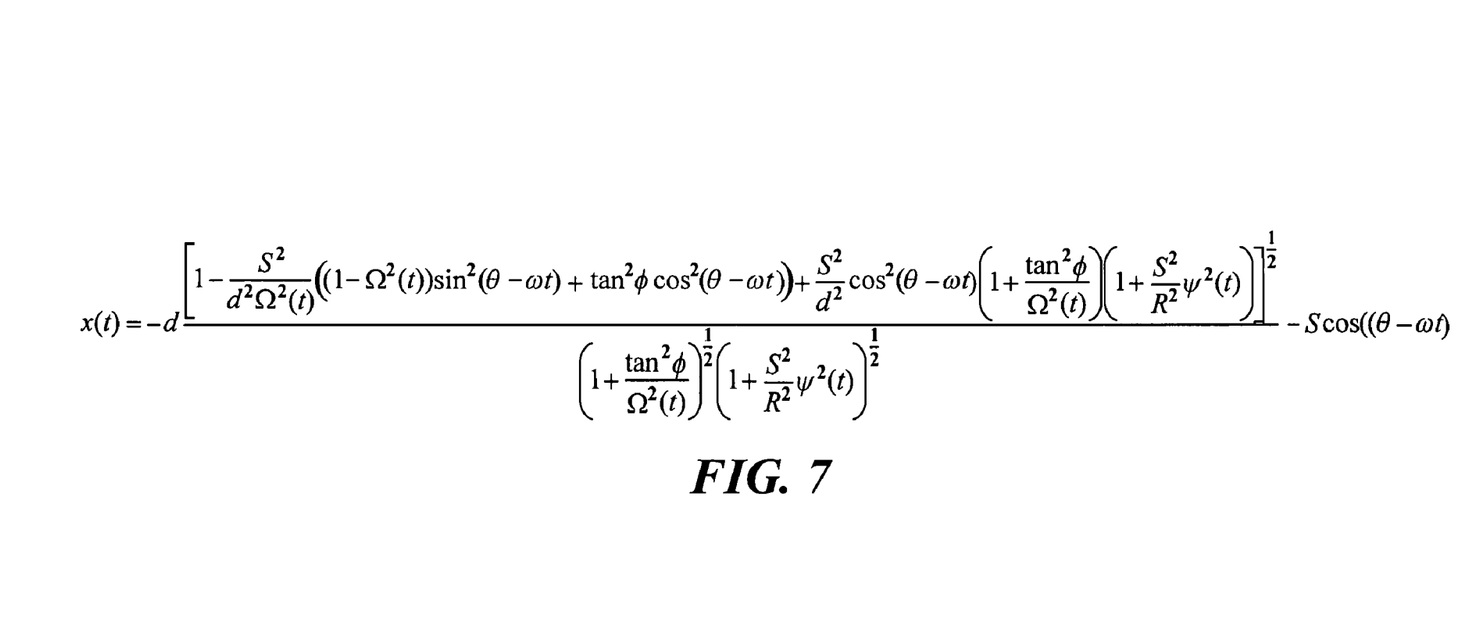
FIG. 7 is an equation illustrating a solution to the vector C that is shown in FIG. 6.

In the above equation, d is the distance corresponding to the delay line (shown in FIG. 1) time delay. The coordinates of C are $C = x(t)\hat{x} + y(t)\hat{y} + z(t)\hat{z}$. The solution of equation (5) then is shown in FIG. 7, where, $$\Omega(t) = 1 - \frac{S\cos(\theta - \omega t)}{R\cos\phi}, \quad (6)$$

and $$\psi^2(t) = \frac{\sin^2(\theta - \omega t)}{\Omega^2(t)\cos^2\phi\left(1 + \frac{\tan^2\phi}{\Omega^2(t)}\right)}.$$

The solution for y(t) may be given in terms of x(t), where $$y(t) = \frac{S\sin(\theta - \omega t)}{\Omega(t)}\left(1 + \frac{x(t)}{R\cos\phi}\right) \quad (7)$$

Similarly, for the solution of z(t), $$z(t) = \frac{-\tan\phi}{\Omega(t)}(x(t) + S\cos(\theta - \omega t)) \quad (8)$$

The above solutions are exact buy are expressed in such a way that approximations may be made in the parameters S/R and S/d. To get an approximation of what the trajectory looks like, take the zero order approximation in S/R and S/d. In this case, $$x(t) \approx -d\cos\phi - S\cos(\theta - \omega t)$$
$$y(t) \approx S\left(1 - \frac{d}{R}\right)\sin(\theta - \omega t)$$
$$z(t) \approx d\sin\phi$$

(9)

The ground range coordinate is essentially x(t). The motion in x(t) describes the full circular motion in the range direction offset by the ground projection of the delay line distance. This is in contrast with the y(t) motion where it is seen that the circular motion in the azimuthal direction is compressed by exactly the factor associated with the compactness of the range. The z(t) expression simply expresses the fact that in the zero order, the trajectory is roughly horizontal. In fact, Equation (9) is the equation of an ellipse centered at $(x,y,z) = (-d \cos \phi, 0, d \sin \phi)$. If one defined a compactness parameter, $$P = 1 - \frac{d}{R}, \quad (10)$$

then the eccentricity of the ellipse is $e = \sqrt{1-P^2}$.

In order to ensure that the motion of C is simulating the desired circular orbit of S, any error in the coordinate expressions should be much less than the resolution. For 0.1 meter resolution operation, we assume that S~100 m, R~10,000 m, and d~10,000 m. Thus, terms of order $S^2/d$ and $S^2d/R^2$ need to be retained. The next higher order terms proportional to $S^3/R^2$ is of order 0.01 m. S~100 m would be a capable conventional ISAR range. In practice, S will be smaller and this allows more terms to be neglected.

Figure 8:
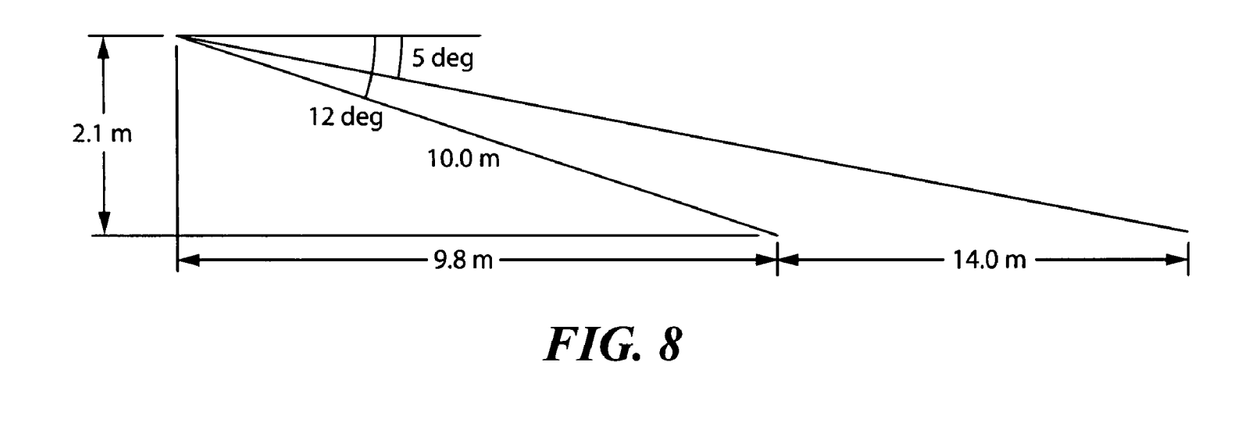
FIG. 8 is a diagram illustrating a geometric setup for a compact radar test range in accordance with one embodiment.

Referring next to FIG. 8, one example geometry of the compact radar test range is demonstrated. It should be understood that many different geometries can be utilized and the following discussion is only one advantageous setup. As shown above in relation to the discussion following Equation (1), the range, according to one embodiment, needs to be at least 10 meters long. As in one embodiment, the range is indoors, limiting the required height of the radar is also advantageous in some embodiments. Thus, the typical depression angles are preferably small. FIG. 8 demonstrates one possible compact geometry.

In this geometry the available beamwidth in the elevation direction allows for a total x-direction excursion of 14 m. From Equation (9) the x-direction excursion also determines the value for S. In this case, if the maximum value is used, S=7 m. One reasonable value for R is R=10 km and, from above we assume R–d=14.2 m. With these values, the terms of order $S^2/d$, $S^2d/R^2$, and higher can be neglected when compared to the resolution ρ in the equation shown in FIG. 7. Under these assumptions, the equation shown in FIG. 7 and Equations (6)-(8) become, $$x(t) \cong \frac{-d}{\sqrt{1 + \frac{\tan^2\phi}{\Omega^2(t)}}} - S\cos(\theta - \omega t) \quad (11)$$

$$y(t) \cong \frac{S\sin(\theta - \omega t)}{\Omega(t)}\left(1 - \frac{\sqrt{1 + \frac{\tan^2\phi}{\Omega^2(t)}}}{R\cos\phi} - S\cos(\theta - \omega t)\right)$$

$$z(t) = \frac{d}{\sqrt{1 + \frac{\Omega^2(t)}{\tan^2\phi}}}$$

Figure 9:
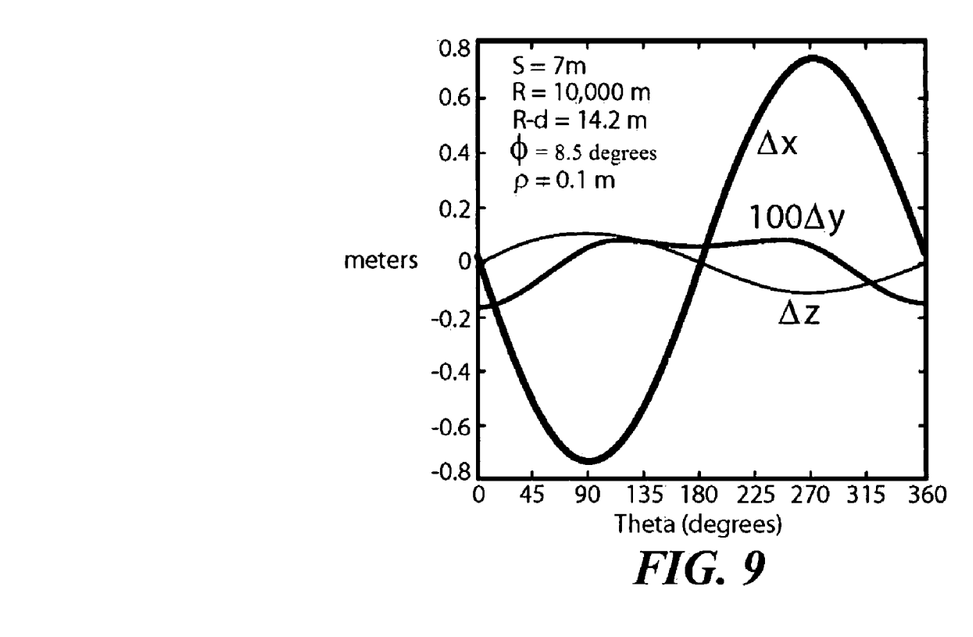
FIG. 9 illustrates the minimal amount of motion of a target that is needed to form an image for a given geometric setup in accordance with one embodiment.

We calculate how much excursion there is in the components of C during a single image. During an aperture, the rotation angle, $\omega t = a_w \lambda/2 \rho = 0.107$ radians for the window factor, $a_w = 1.2$, and 0.1 m resolution is needed. The result is shown below in FIG. 9. FIG. 9 demonstrates the minimal amount of motion of the target needed to form an image for a given initial angle corresponding to the start of the aperture.

As a function of time, each coordinate increases approximately linearly with time. The total excursion of each coordinate is what is plotted in FIG. 9 as a function of the initial angle, θ, as defined in FIG. 6. Referring back to FIG. 6, it is clear that at 90 degrees, for instance, the x coordinate excursion is large and negative at θ=90 degrees as S rotates. The z-coordinate excursion is smaller but is positive to keep d constant. The y-coordinate is much smaller in magnitude. It is in fact around 1 mm at its maximum excursion, that is, it is much smaller than a wavelength and hence, in many instances can likely be set to Δy=0. In this case, it is seen that the motion is approximately linear in the x-z plane.

Figure 10:
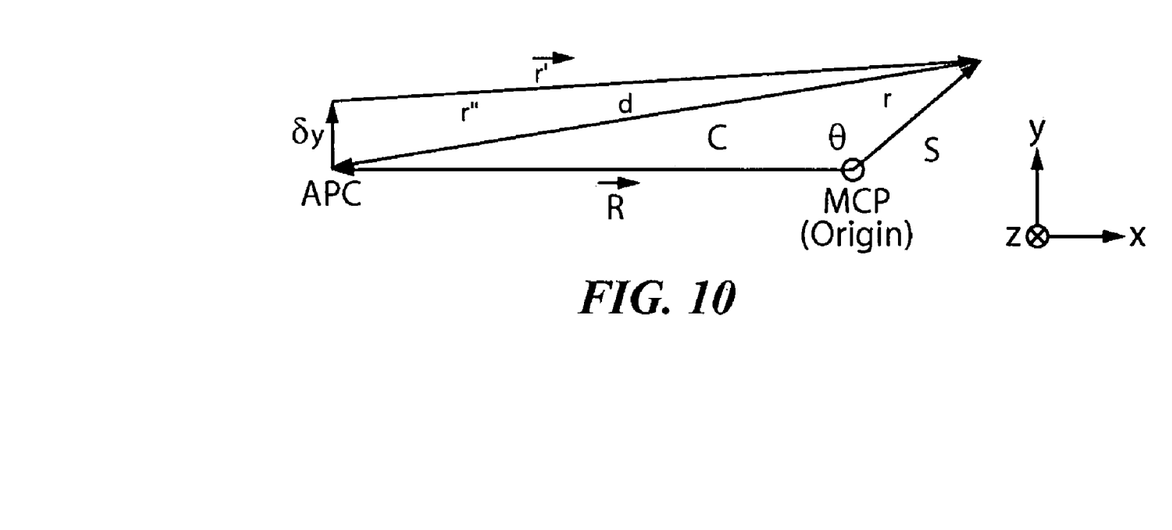
FIG. 10 illustrates an example of a radar displacement which causes path differences in the compact geometry in the standard ISAR geometry.

One of the main uses for range testing will be in testing motion compensation with the radar on a vibration table. A potential difficulty with this compact range scheme is that the change in path length caused by the radar motion is different in the compact range than in a conventional ISAR range. FIG. 10 demonstrates an example of a radar displacement which causes path differences in the compact geometry in the standard ISAR geometry.

Suppose at some moment during the aperture, the radar undergoes a displacement, δ y. The path length that is assumed by the compact range equations is r″+d. This is in contrast with the path length that the radar assumes, which is r′. As an estimate of this, this path difference for φ=0, θ=0. For this simplified case, given by $$r''+d-r' = \sqrt{(R+S-d)^2 + \delta y^2} + d - \sqrt{R^2 + 2RS + S^2 + \delta y^2} \quad (13)$$

To the lowest order in $\delta y^2$, $$r'' + d - r' \cong \frac{\delta y^2}{2S} \quad (14)$$

Figure 11:
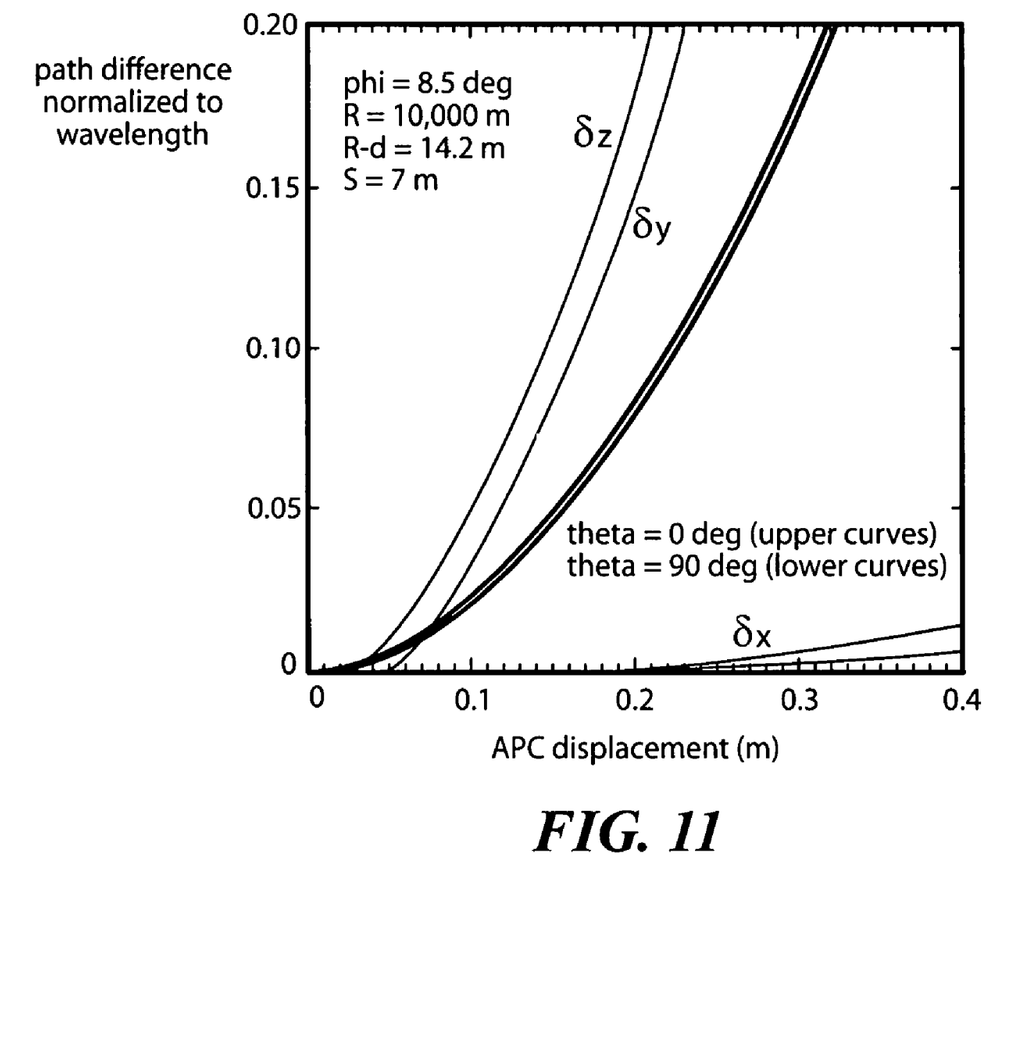

Preferably, this path difference is much smaller than the wavelength. For the path difference to be less than 0.1λ, with S=7 m, Equation (14) implies δy<11 cm. In order to address this issue generally, it is necessary to calculate the path difference with the exact expressions (Equation from FIG. 7 and Equations (6)-(8)) in three dimensions. The result is shown in FIG. 11 which shows the path difference normalized to the wavelength as a function of the APC displacement for x, y, z displacements at $\theta=0$ and $\theta=90$.

For each curve, the displacement is in one dimension only. It is clear that large motions such as might be obtained with a Scoresby table may be problematical, but vibration amplitudes characteristic of reasonable level KingAir flight are likely fine. It is seen that as long as the displacement is less than 15 cm, the path difference between the compact range path and the motion compensated path is less than one-tenth of a wavelength.

An additional feature of the compact radar test system is that the RF Tag may be used to impose a false Doppler on the return chirp and thus, a moving target at long range may be simulated. Since the actual range excursion will be limited, the radar GMTI mode cannot be tested with any processing algorithm where the actual motion of the target and its Doppler are correlated. It is nonetheless quite useful to validate and qualify the GMTI behavior with uncorrelated positions and velocities.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

I claim:

1. A compact radar test range comprising:
 a radar;
 a moving platform; and
 a tag positioned on the moving platform, the tag including an antenna and a delay, the tag for receiving signals sent by the radar while at a first position and sending signals back to the radar while the tag is in motion.

2. The compact radar test range of claim 1 wherein the delay is an optical delay line.

3. The compact radar test range of claim 1 further comprising a radar motion platform, wherein the radar is positioned on the radar motion platform.

4. The compact radar test range of claim 1 further comprising a radar motion table controller for controlling the motion of the radar motion platform.

5. The compact radar test range of claim 1 further comprising a motion platform controller for moving the tag in a predetermined path.

6. The compact radar test range of claim 1 wherein the radar, the moving platform and the tag are located indoors.

7. The compact radar test range of claim 1 wherein the tag imposes a false Doppler on a return chirp to simulate a moving target.

8. A system for testing radar comprising:
 a target motion platform;
 a target motion platform controller for controlling motion of the platform;
 a tag located on the target motion platform;
 a radar for sending a signal to the tag; and
 a motion measurement simulator for inputting data to the radar to simulate movement of the radar.

9. The system of claim 8 wherein the target motion controller moves the tag in a predetermined manner corresponding to the data that is input to the radar.

10. The system of claim 8 further comprising:
 a radar motion platform, wherein the radar is positioned on the radar motion platform; and
 a radar motion platform controller for controlling the movement of the radar motion platform.

11. The system of claim 10 further comprising an inertial measurement unit for measuring the movement of the radar.

12. The system of claim 11 comprising a master controller coupled to the radar motion platform controller and the target motion platform controller.

13. The system of claim 12 further comprising a global positioning system coupled to the motion measurement simulator.

14. The system of claim 8 wherein the system is located indoors.

15. The system of claim 8 wherein the tag imposes a false Doppler on a return chirp to simulate a moving target.

16. The system of claim 8 further comprising:
 an antenna coupled to the tag; and
 a delay coupled to the tag.

17. The system of claim 8 wherein the delay is an optical delay line.

18. A method for testing radar comprising:
 sending signals from a radar;
 receiving the signals from the radar at a tag;
 delaying the signals received from the radar;
 moving the tag in a predetermined manner to simulate movement of the radar while sending signals back to the radar.

19. The method for testing radar of claim 18 further comprising providing the radar with data that corresponds to the predetermined movement of the tag.

20. The method for testing radar of claim 19 further comprising moving the radar to simulate flying conditions.

21. The method for testing radar of claim 20 further comprising measuring the movement of the radar with an inertial measurement unit.

22. The method for testing radar of claim 18 wherein the tag is positioned on a moving platform.

23. The method for testing radar of claim 22 wherein the tag imposes a false Doppler on a return chirp to simulate a moving target.

* * * * *